(12) United States Patent
Hao et al.

(10) Patent No.: US 12,520,515 B2
(45) Date of Patent: Jan. 6, 2026

(54) P-CHANNEL ENHANCEMENT MODE SEMICONDUCTOR DEVICE AND METHOD FOR MANUFACTURING THE SAME

(71) Applicant: INNOSCIENCE (SUZHOU) TECHNOLOGY CO., LTD., Suzhou (CN)

(72) Inventors: Ronghui Hao, Suzhou (CN); Fu Chen, Suzhou (CN); King Yuen Wong, Suzhou (CN)

(73) Assignee: INNOSCIENCE (SUZHOU) TECHNOLOGY CO., LTD., Suzhou (CN)

(*) Notice: Subject to any disclaimer, the term of this patent is extended or adjusted under 35 U.S.C. 154(b) by 1137 days.

(21) Appl. No.: 17/598,306

(22) PCT Filed: Sep. 7, 2021

(86) PCT No.: PCT/CN2021/116884
§ 371 (c)(1),
(2) Date: Mar. 16, 2023

(87) PCT Pub. No.: WO2023/035103
PCT Pub. Date: Mar. 16, 2023

(65) Prior Publication Data
US 2024/0047567 A1 Feb. 8, 2024

(51) Int. Cl.
*H10D 30/47* (2025.01)
*H10D 30/01* (2025.01)
(Continued)

(52) U.S. Cl.
CPC ......... *H10D 30/475* (2025.01); *H10D 30/015* (2025.01); *H10D 30/791* (2025.01); *H10D 62/8503* (2025.01); *H10D 64/518* (2025.01)

(58) Field of Classification Search
CPC .. H10D 30/015; H10D 30/471; H10D 30/472; H10D 30/473; H10D 30/4732;
(Continued)

(56) References Cited

U.S. PATENT DOCUMENTS 6,599,781 B1 7/2003 Li
10,256,332 B1* 4/2019 Chen .................... H10D 62/824
(Continued)

FOREIGN PATENT DOCUMENTS

CN 101897029 A 11/2010
CN 103489911 A 1/2014
(Continued)

OTHER PUBLICATIONS

International Search Report and Written Opinion of the corresponding PCT application No. PCT/CN2021/116884 mailed on May 26, 2022.
(Continued)

*Primary Examiner* — Eric A. Ward
(74) *Attorney, Agent, or Firm* — Li & Cai Intellectual Property (USA) Office (57) ABSTRACT

A semiconductor device includes a first and a second nitride-based semiconductor layers, a source electrode, a drain electrode, a passivation layer, a stress modulation layer and a gate electrode. The stress modulation layer is disposed over the second nitride-based semiconductor layer and extends along at least one sidewall of the passivation layer to make contact with the second nitride-based semiconductor layer, so as to form an interface. The gate electrode is disposed over the stress modulation layer and between the source and drain electrodes. The gate electrode is located directly above the interface of the stress modulation layer and the second nitride-based semiconductor layer.

20 Claims, 9 Drawing Sheets

(51) Int. Cl.
*H10D 30/69* (2025.01)
*H10D 62/85* (2025.01)
*H10D 64/27* (2025.01)

(58) Field of Classification Search
CPC .......... H10D 30/4735; H10D 30/4738; H10D 30/474; H10D 30/475; H10D 30/4755; H10D 30/476; H10D 30/477; H10D 30/478; H10D 30/47
See application file for complete search history.

(56) References Cited

U.S. PATENT DOCUMENTS

| | | | |
|---|---|---|---|
| 2009/0121217 A1 | 5/2009 | Iwakami | |
| 2009/0146185 A1 | 6/2009 | Suh et al. | |
| 2010/0155720 A1 | 6/2010 | Kaneko | |
| 2010/0308400 A1 | 12/2010 | Darwish et al. | |
| 2014/0008658 A1 | 1/2014 | Siemieniec et al. | |
| 2014/0374765 A1* | 12/2014 | Curatola | H10D 30/4732 438/172 |
| 2017/0200817 A1 | 7/2017 | Curatola et al. | |
| 2018/0350944 A1 | 12/2018 | Huang | |
| 2020/0144407 A1* | 5/2020 | Bader | H10D 30/015 |
| 2020/0403081 A1 | 12/2020 | Sung et al. | |
| 2021/0013333 A1* | 1/2021 | Yang | H01L 21/76283 |

FOREIGN PATENT DOCUMENTS

| | | |
|---|---|---|
| CN | 103531624 A | 1/2014 |
| CN | 104241350 A | 12/2014 |
| CN | 109524460 A | 3/2019 |
| CN | 110875387 A | 3/2020 |
| JP | 2017195400 A | 10/2017 |
| TW | 201448227 A | 12/2014 |
| WO | 2010064383 A1 | 6/2010 |

OTHER PUBLICATIONS

First Office Action of the corresponding China patent application No. 202180003945.7 mailed on Jul. 15, 2022.

* cited by examiner

P-CHANNEL ENHANCEMENT MODE SEMICONDUCTOR DEVICE AND METHOD FOR MANUFACTURING THE SAME

FIELD OF THE DISCLOSURE

The present disclosure generally relates to a nitride-based semiconductor device. More specifically, the present disclosure relates to a p-channel enhancement mode semiconductor device with a stress modulation layer to form a discontinuous two-dimensional hole gas (2DHG) region.

BACKGROUND

In recent years, intense research on high-hole-mobility transistors (HHMTs) has been prevalent, particularly for high power switching and high frequency applications. III-nitride-based HHMTs utilize a heterojunction interface between two materials with different bandgaps to form a quantum well-like structure, which accommodates a two-dimensional hole gas (2DHG) region, satisfying demands of high power/frequency devices. With respect to practical demands, the HHMTs need to be designed to be normally-off. However, due to process factors, the development of the normally-off HHMTs encounters manufacturing challenges. At present, there is a need to improve the yield rate for the normally-off HHMTs, thereby making them suitable for mass production.

SUMMARY OF THE DISCLOSURE

In accordance with one aspect of the present disclosure, a semiconductor device is provided. A semiconductor device includes a first nitride-based semiconductor layer, a second nitride-based semiconductor layer, a source electrode, a drain electrode, a passivation layer, a stress modulation layer and a gate electrode. The second nitride-based semiconductor layer is disposed on the first nitride-based semiconductor layer and has a bandgap less than a bandgap of the first nitride-based semiconductor layer to form a heterojunction therebetween with a two dimensional hole gas (2DHG) region. The source electrode and the drain electrode are disposed over the second nitride-based semiconductor layer. The passivation layer is disposed over the second nitride-based semiconductor layer and between the source and drain electrodes. The stress modulation layer is disposed over the second nitride-based semiconductor layer and extends along at least one sidewall of the passivation layer to make contact with the second nitride-based semiconductor layer, so as to form an interface. The gate electrode is disposed over the stress modulation layer and between the source and drain electrodes. The gate electrode is located directly above the interface between the stress modulation layer and the second nitride-based semiconductor layer.

In accordance with one aspect of the present disclosure, a semiconductor device is provided. A semiconductor device includes a first nitride-based semiconductor layer, a second nitride-based semiconductor layer, a source electrode, a drain electrode, a passivation layer, a stress modulation layer and a gate electrode. The second nitride-based semiconductor layer is disposed on the first nitride-based semiconductor layer and has a bandgap less than a bandgap of the first nitride-based semiconductor layer to form a heterojunction therebetween with a two dimensional hole gas (2DHG) region. The source electrode and a drain electrode are disposed over the second nitride-based semiconductor layer. The passivation layer is disposed over the second nitride-based semiconductor layer and between the source and drain electrodes. The passivation layer has a first portion and a second portion which are separated from each other. The stress modulation layer is disposed over the second nitride-based semiconductor layer and is filled in a region between the first and second portions of the passivation layer. The stress modulation layer applies stress to the second nitride-based semiconductor layer, such that the 2DHG region has a zone beneath the gate electrode with a hole concentration reduced. The gate electrode is disposed over the stress modulation layer and between the first and second portions of the passivation layer, so as to align the zone of the 2DHG region.

In accordance with one aspect of the present disclosure, a method for manufacturing a semiconductor device is provided. The method includes steps as follows. A first nitride-based semiconductor layer is formed. A second nitride-based semiconductor layer is formed on the first nitride-based semiconductor layer to form a heterojunction therebetween. A source electrode and a drain electrode are formed above the second nitride-based semiconductor layer. A passivation layer is formed above the second nitride-based semiconductor layer. A portion of the passivation layer is removed to form an opening exposing the second nitride-based semiconductor layer. A stress modulation layer is formed above the passivation layer and fills into the opening to make contact with the second nitride-based semiconductor layer, such that the 2DHG region has a zone beneath the gate electrode with a hole concentration reduced. A gate electrode is formed above the stress modulation layer and aligns with the opening.

By the above configuration, the first and the second nitride-based semiconductor layers with different bandgaps are stacked on one another, so as to form a heterojunction therebetween with a 2DHG region. By placing a stress modulation layer on a portion of the second nitride-based semiconductor layer, the polarization effect therein is suppressed, and thus a zone of the 2DHG region has a reduced hole concentration. Accordingly, a discontinuous 2DHG region is formed, and the p-channel enhancement mode semiconductor device can be realized. The manufacturing process of the semiconductor device is simple and avoids using additional etching step to etch the nitride-based semiconductor layer for interfering with the continuity of the 2DHG region. Thus, the semiconductor device of the present disclosure can have a good reliability, good electrical properties and a good yield rate.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which.

DETAILED DESCRIPTION

Common reference numerals are used throughout the drawings and the detailed description to indicate the same or similar components. Embodiments of the present disclosure will be readily understood from the following detailed description taken in conjunction with the accompanying drawings.

Spatial descriptions, such as "on," "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

Figure 1A:
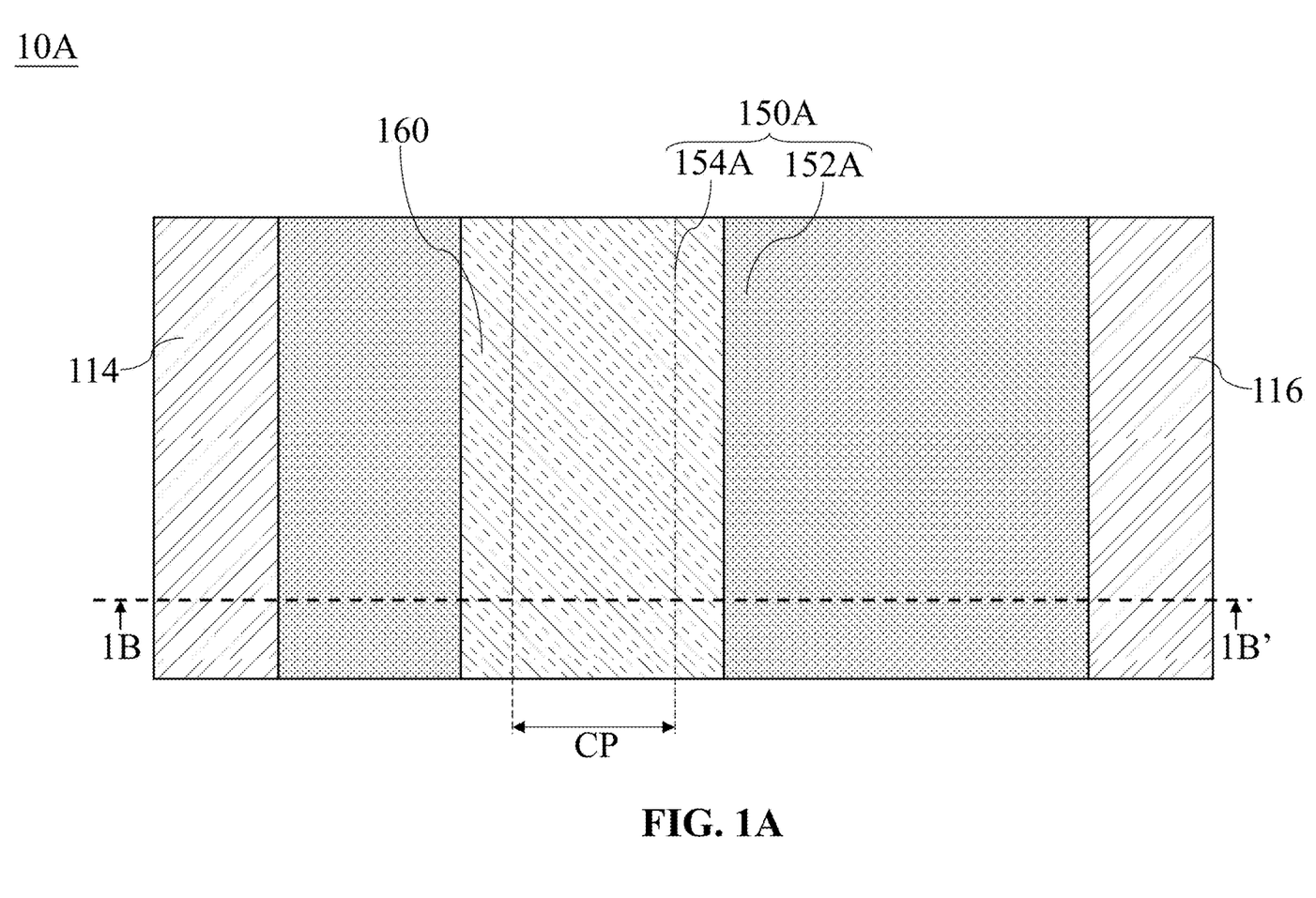
FIG. 1A is a top view of a semiconductor device according to some embodiments of the present disclosure.
Figure 1B:
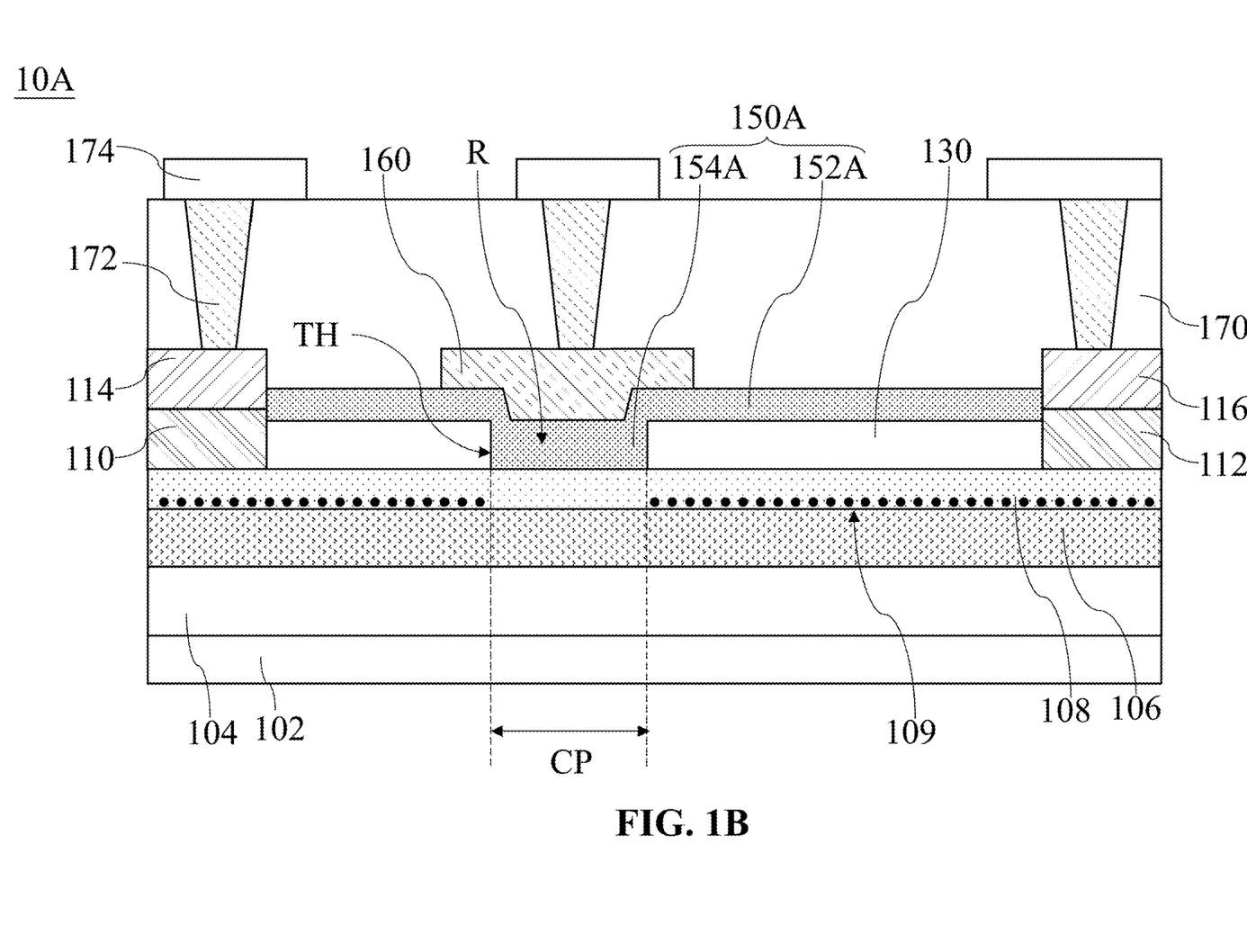
FIG. 1B is a vertical cross-sectional view across a line 1B-1B' in FIG. 1A.

FIG. 1A is a top view of a semiconductor device 10A according to some embodiments of the present disclosure. FIG. 1B is a vertical cross-sectional view across a line 1B-1B' in FIG. 1A. The semiconductor device 10A includes a substrate 102, a buffer layer 104, nitride-based semiconductor layers 106, 108, 110 and 112, electrodes 114 and 116, a passivation layer 130, a stress modulation layer 150A, a gate electrode 160, contact vias 172, and a patterned conductive layer 174.

The substrate 102 may be a semiconductor substrate. The exemplary materials of the substrate 102 can include, for example but are not limited to, Si, SiGe, SiC, gallium arsenide, p-doped Si, n-doped Si, sapphire, semiconductor on insulator, such as silicon on insulator (SOI), or other suitable substrate materials. In some embodiments, the substrate 102 can include, for example, but is not limited to, group III elements, group IV elements, group V elements, or combinations thereof (e.g., III-V compounds). In other embodiments, the substrate 102 can include, for example but is not limited to, one or more other features, such as a doped region, a buried layer, an epitaxial (epi) layer, or combinations thereof.

The buffer layer 104 can be disposed on/over/above the substrate 102. The buffer layer 104 can be disposed between the substrate 102 and the nitride-based semiconductor layer 106. The buffer layer 104 can be configured to reduce lattice and thermal mismatches between the substrate 102 and the nitride-based semiconductor layer 106, thereby curing defects due to the mismatches/difference. The buffer layer 104 may include a III-V compound. The III-V compound can include, for example but are not limited to, aluminum, gallium, indium, nitrogen, or combinations thereof. Accordingly, the exemplary materials of the buffer layer 104 can further include, for example but are not limited to, GaN, AlN, AlGaN, InAlGaN, or combinations thereof. In some embodiments, the semiconductor device 100A may further include a nucleation layer (not shown). The nucleation layer may be formed between the substrate 102 and the buffer layer 104. The nucleation layer can be configured to provide a transition to accommodate a mismatch/difference between the substrate 102 and a III-nitride layer of the buffer layer. The exemplary material of the nucleation layer can include, for example but is not limited to AlN or any of its alloys.

The nitride-based semiconductor layer 106 is disposed on/over/above the buffer layer 104. The nitride-based semiconductor layer 108 is disposed on/over/above the nitride-based semiconductor layer 106. The exemplary materials of the nitride-based semiconductor layer 106 can include, for example but are not limited to, nitrides or group III-V compounds, such as GaN, AlN, InN, $In_xAl_yGa_{(1-x-y)}N$ where $x+y\leq 1$, $Al_yGa_{(1-y)}N$ where $y\leq 1$. The exemplary materials of the nitride-based semiconductor layer 108 can include, for example but are not limited to, group III-V nitride semiconductor materials, such as GaN, AlGaN, InN, AlInN, InGaN, AlInGaN, or combinations thereof.

The exemplary materials of the nitride-based semiconductor layers 106 and 108 are selected such that the nitride-based semiconductor layer 108 has a bandgap (i.e., forbidden band width) less than a bandgap of the nitride-based semiconductor layer 106, which causes electron affinities thereof different from each other and forms a heterojunction therebetween. For example, when the nitride-based semiconductor layer 106 is an AlGaN layer having bandgap of approximately 4.0 eV, the nitride-based semiconductor layer 108 can be selected as a GaN layer having a bandgap of approximately 3.4 eV. As such, the nitride-based semiconductor layers 106 and 108 can serve as a barrier layer and a channel layer, respectively. A triangular well potential is generated at a bonded interface between the channel and barrier layers, so that holes accumulate in the triangular well, thereby generating a two-dimensional hole gas (2DHG) region 109 adjacent to the heterojunction. It should be noted that the formation of the 2DHG region is positively related to the extent of the polarization effect between the channel and barrier layers. Accordingly, the semiconductor device 10A is available to include at least one GaN-based high-hole-mobility transistor (HHMT).

The nitride-based semiconductor layers 110 and 112 are disposed on/above/over the nitride-based semiconductor layer 108. The nitride-based semiconductor layers 110 and 112 are directly in contact with different portions of the nitride-based semiconductor layer 108. The nitride-based semiconductor layers 110 and 112 are doped to have the same conductivity type, such as a p-type. The exemplary materials of the nitride-based semiconductor layers 110 and 112 can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Zn, Cd, and Mg.

In some embodiments, the nitride-based semiconductor layers 108, 110 and 122 have the same group III element and the same group V element. For example, the nitride-based semiconductor layer 108 can be an undoped GaN layer, which means that the nitride-based semiconductor layer 108 is an intrinsic semiconductor. The nitride-based semiconductor layers 110 and 112 can be p-doped GaN layers, which means that the nitride-based semiconductor layers 110 and 112 are p-type semiconductors. That is, the nitride-based semiconductor layers 108, 110 and 112 have the same group III element (e.g., gallium (Ga)) and the same group V element (e.g., the nitrogen (N)). Thus, the lattice mismatch between one of the nitride-based semiconductor layers 110 and 112 and the nitride-based semiconductor layer 108 can be reduced.

The electrodes 114 and 116 can be disposed on/over/above the nitride-based semiconductor layer 108. The electrodes 114 and 116 are directly in contact with the nitride-based semiconductor layers 114 and 116, respectively. In some embodiments, the electrode 114 can serve as a source electrode. In some embodiments, the electrode 114 can serve as a drain electrode. In some embodiments, the electrode 116 can serve as a source electrode. In some embodiments, the electrode 116 can serve as a drain electrode. In some embodiments, each of the electrodes 114 and 116 can serve as a source/drain (S/D) electrode or a S/D contact, which means they can serve as a source electrode or a drain electrode, depending on the device design.

The electrode 114 and the nitride-based semiconductor layer 110 can serve as a source structure or a drain structure. The nitride-based semiconductor layer 110 is disposed between the electrode 114 and the nitride-based semiconductor layer 108. The electrode 114 can form an ohmic contact with the nitride-based semiconductor layer 108 through the nitride-based semiconductor layer 110. In some embodiments, the nitride-based semiconductor layer 110 can be omitted, such that the electrode 114 can be directly in contact with the nitride-based semiconductor layer 108.

The electrode 116 and the nitride-based semiconductor layer 116 can serve as a source structure or a drain structure. The nitride-based semiconductor layer 112 is disposed between the electrode 116 and the nitride-based semiconductor layer 108. The electrode 116 can form an ohmic contact with the nitride-based semiconductor layer 108 through the nitride-based semiconductor layer 112. In some embodiments, the nitride-based semiconductor layer 112 can be omitted, such that the electrode 116 can be directly in contact with the nitride-based semiconductor layer 108.

In some embodiments, the electrodes 114 and 116 can include, for example but are not limited to, metals, alloys, doped semiconductor materials (such as doped crystalline silicon), compounds such as silicides and nitrides, other conductor materials, or combinations thereof. The exemplary materials of the electrodes 114 and 116 can include, for example but are not limited to, Ti, AlSi, TiN, or combinations thereof. Each of the electrodes 114 and 116 may be a single layer, or plural layers of the same or different composition. In some embodiments, the electrodes 114 and 116 form ohmic contacts with the nitride-based semiconductor layer 108. The ohmic contacts can be achieved by applying Ti, Al, or other suitable materials to the electrodes 114 and 116. In some embodiments, each of the electrodes 114 and 116 is formed by at least one conformal layer and a conductive filling. The conformal layer can wrap the conductive filling. The exemplary materials of the conformal layer, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

The passivation layer 130 is disposed on/above/over the nitride-based semiconductor layer 108. The passivation layer 130 is located between the electrodes 114 and 116. The passivation layer 130 is in contact with the nitride-based semiconductor layer 108. The passivation layer 130 abuts against sidewalls of the nitride-based semiconductor layers 110 and 112. The passivation layer 130 has a through hole TH to define a region R between inner sidewalls thereof. In the other point of view, the passivation layer 130 includes portions which are separated from each other, and the region R is located between the separated portions of the passivation layer 130.

The stress modulation layer 150A is disposed on/above/over the nitride-based semiconductor layer 108. The stress modulation layer 150A extends from a top surface of the passivation layer 130 into the region R of the passivation layer 130. The stress modulation layer 150A extends along the inner sidewalls of the passivation layer 130 to make contact with the nitride-based semiconductor layer 108, thereby forming an interface therebetween.

The stress modulation layer 150A includes two portions 152A and 154A connected to each other. The portion 152A surrounds the portion 154A. The portion 152A encloses two opposite sides of the portion 154A. The portion 152A is disposed on/above/over the top surface of the passivation layer 130. The portion 152A is in contact with the top surface of the passivation layer 130.

The portion 154A is disposed in the region R of the passivation layer 130. The portion 154A entirely fills into the region R via the through hole TH of the passivation layer 130. The portion 154A is located between the inner sidewalls of the passivation layer 130. The portion 154A is in contact with a contact portion CP of the nitride-based semiconductor layer 108 and the inner sidewalls of the passivation layer 130. The portion 154A forms the interface with the contact portion CP of the nitride-based semiconductor layer 108.

In the exemplary illustration of FIG. 1A, the portion 154A is shaped as being oblong and has left and right sides. The left and right sides of the portion 154A are parallel with the electrodes 114 and 116 such that the interface between the nitride-based semiconductor layer 108 and the stress modulation layer 150A has long sides parallel with the electrodes 114 and 116, which is advantageous to the design of drift regions. The electrode 114 can be designed as being closer to the interface than the electrode 116. The formation of the through hole TH of the passivation layer 130 can better define the contact region of the nitride-based semiconductor layer 108 desired to be contacted by the portion 154A of the stress modulation layer 150A.

The portion 154A is in a position lower than the portion 152A. The portion 152A has a pair of oblique inner side surfaces facing each other and connected to the portion 154A. The oblique inner side surfaces of the portion 152A of the stress modulation layer 150A can be advantageous to bearing a layer to be formed thereon, so as to achieve a better stress distribution in the semiconductor device 10A.

The material of the stress modulation layer 150A is different from that of the nitride-based semiconductor layer 108, such that the stress modulation layer 150A has a lattice constant and a bandgap different than those of the nitride-based semiconductor layer 108. The exemplary material of the stress modulation layer 150A can include, for example but is not limited to, AlN, BN, AlBN, GaN, other suitable material or any combination of the aforesaid materials.

Since the stress modulation layer 150A has the portion 154A in contact with the contact portion CP of the nitride-based semiconductor layer 108 and having the different material (or different material properties) than the nitride-based semiconductor layer 108, the stress modulation layer 150A can apply a compressive stress thereto. The stress distribution of the nitride-based semiconductor layers 106 and 108 can be altered/changed/adjusted/controlled by the stress modulation layer 150A so as to further re-distribute the concentration of the 2DHG region 109.

The gate electrode 160 is disposed on/above/over the stress modulation layer 150A. The gate electrode 160 is in contact with the stress modulation layer 150A. the gate electrode 160 covers the portions 152A and 154A of the stress modulation layer 150A. The gate electrode 160 is located directly above the interface between the stress modulation layer 150A and the nitride-based semiconductor layer 108. The gate electrode 160 has a downward protruding portion/bottom portion received by the stress modulation layer 150A. The downward protruding portion/the bottom portion of the gate electrode 160 aligns the region R between the inner sidewalls of the passivation layer 130.

A bottom-most surface of the gate electrode 160 is in contact with the portion 154A of the stress modulation layer 150A. The bottom-most surface of the gate electrode 160 can be coplanar with the top surface of the passivation layer 130. The gate electrode 160 is in contact with the oblique inner side surfaces of the stress modulation layer 150A. The configuration of the oblique inner side surfaces can increase the contact area between the stress modulation layer 150A and the gate electrode 160, and thus the bonding force therebetween can be enhanced, thereby avoiding a peeling issue.

The gate electrode 160 is positioned between the electrodes 114 and 116. A distance between the gate electrode 160 and the electrode 114 is less than a distance between the gate electrode 160 and the electrode 116. In other embodiments, the distance between the gate electrode 160 and the electrode 114 can be equal to the distance between the gate electrode 160 and the electrode 116.

The exemplary materials of the gate electrode 160 may include metals or metal compounds. The gate electrode 160 may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, metal alloys or compounds thereof, or other metallic compounds.

The electrodes 114 and 116 and the gate electrode 160 can constitute parts of a HHMT transistor in the semiconductor device 10A. In some embodiments, these elements can constitute parts of a p-channel transistor. The stress re-distribution provided by the stress modulation layer 150A can bring the HHMT transistor to an enhancement mode, which is detailed described as follows.

In a HHMT transistor, without any external factor, a continuous 2DHG region can be automatically formed in a layer with a smaller bandgap (i.e., a channel layer). For example, the 2DHG region 109 is formed in the nitride-based semiconductor layer 108 and near the heterojunction between the nitride-based semiconductor layers 106 and 108. The formation of a 2DHG region is positively related to the extent of the polarization effect between channel and barrier layers (i.e., the nitride-based semiconductor layers 106 and 108).

In response to the stress re-distribution provided by the stress modulation layer 150A, a zone of the 2DHG region 109 in the contact portion CP would have different characteristics (e.g., different hole concentrations) than the remaining of the 2DHG region 109 and thus is blocked, creating the discontinuous 2DHG region 109. As such, the continuity of the 2DHG region 109 would be disrupted. That is, the zone of 2DHG region 109 beneath the region R has a low hole concentration, which approaches to zero or is approximately zero.

Accordingly, the stress modulation layer 150A can serve as an external factor with respect to the nitride-based semiconductor layers 106 and 108 to affect the 2DHG region 109. In some embodiment, the external factor includes applying a compressive stress provided by the stress modulation layer 150A to the contact portion CP of the nitride-based semiconductor layer 108. The compressive stress can suppress the polarization effect in the contact portion CP, such that the zone of the 2DHG region 109 in the contact portion CP would have the reduced hole concentration. Accordingly, a discontinuous 2DHG region 109 is formed.

As the downward protruding portion/the bottom portion of the gate electrode 160 aligns the region R, the gate electrode 160 can align the zone of the 2DHG region 109 as well. Therefore, the zone of the 2DHG region 109 beneath the gate electrode 160 has the reduced hole concentration so it brings the HHMT transistor of the semiconductor device 10A to an enhancement mode device, which is in a normally-off state when the gate electrode 160 is at approximately zero bias.

Due to such mechanism, the semiconductor device 10A has a normally-off characteristic. In other words, when no voltage is applied to the gate electrode 160 or a voltage applied to the gate electrode 160 is less than a threshold voltage (i.e., a minimum voltage required to form an inversion layer below the gate electrode 160), the contact portion CP below the gate electrode 160 (e.g., a portion of the heterojunction beneath the gate electrode 160) is kept blocked, and thus no current flows therethrough. As such, at least by controlling the stress distribution in the nitride-based semiconductor layer 108, the semiconductor device 10A is available to include at least one GaN-based p-channel HHMT having an enhancement mode.

In this regard, to achieve a normally-off p-channel semiconductor device, practically, other manners for disrupting continuity of a 2DHG region of a p-channel semiconductor device between source and drain electrodes may be used. One way to achieve a normally-off p-channel semiconductor device is to form a recess structure filled with a gate electrode, thereby extinguishing a zone of a 2DHG region directly under the gate electrode. Accordingly, there is a need to perform a destructive step, such as an etching step. However, the recessed surface may result in carrier scattering, thereby reducing the carrier mobility and enhancing the on-resistance of the semiconductor device.

As compared with the afore-mentioned normally-off p-channel semiconductor device with a recess structure, the semiconductor device 10A creates the discontinuous 2DHG region 109 in the nitride-based semiconductor layer 108 by placing the stress modulation layer 150A to provide the stress re-distribution, so as to realize the p-channel enhancement mode semiconductor device. Accordingly, there is no need to form a recess structure into the nitride-based semiconductor layer 108, thereby exempting an issue of controlling the depth of the recess structure. As such, the gate electrode 160 can be disposed on the nitride-based semiconductor layer 108 instead of being disposed in an inward recess. Such a configuration would not interfere with the hole transportation in the nitride-based semiconductor layer 108. In summary, the semiconductor device 10A can have good electrical properties, a good reliability, and a good yield rate.

In some embodiments, at least for a purpose of better controlling the stress distribution, the stress modulation layer 150A can be a crystal structure. In some embodiments, at least for a purpose of reducing the manufacturing costs, the stress modulation layer 150A can be an amorphous structure.

The passivation layer 170 covers the electrodes 114 and 116 and the gate electrode 160. The passivation layer 170 covers the stress modulation layer 150A. In some embodiments, the passivation layer 170 can serve as a planarization layer which has a level top surface to support other layers/elements. In some embodiments, the passivation layer 170 can be formed as a thicker layer, and a planarization process, such as chemical mechanical polish (CMP) process, is performed on the passivation layer 170 to remove the excess portions, thereby forming a level top surface. The material of the passivation layer 170 can include, for example but are not limited to, dielectric materials. For example, the passivation layer 170 can include $SiN_x$, $SiO_x$, SiON, SiC, SiBN, SiCBN, oxides, nitrides, plasma enhanced oxide (PEOX), or combinations thereof.

The contact vias 172 are disposed within the passivation layer 170. The contact vias 172 can penetrate the passivation layer 170. The contact vias 172 can extend longitudinally to connect to the electrodes 114 and 116 and the gate electrode 160. The upper surfaces of the contact vias 172 are free from coverage of the passivation layer 170. The exemplary materials of the contact vias 172 can include, for example but are not limited to, conductive materials, such as metals or alloys.

The patterned conductive layer 174 is disposed on/over/above the passivation layer 170 and the contact vias 172. The patterned conductive layer 174 is in contact with the contact vias 172. The patterned conductive layer 174 may have metal lines, pads, traces, or combinations thereof, such that the patterned conductive layer 174 can form at least one circuit. Hence, the patterned conductive layer 174 can be served as a patterned circuit layer. The patterned conductive layer 174 can connect with the electrodes 114 and 116 and the gate electrode 160 by the contact vias 172. An external electronic device can send at least one electronic signal to the semiconductor device 10A by the patterned conductive layer 174, and vice versa. The exemplary materials of the patterned conductive layer 174 can include, for example but are not limited to, conductive materials. The patterned conductive layer 174 may include a single film or multilayered film having Ag, Al, Cu, Mo, Ni, Ti, alloys thereof, oxides thereof, nitrides thereof, or combinations thereof.

Different stages of a method for manufacturing the semiconductor device 10A are shown in FIG. 2A, FIG. 2B, FIG. 2C, FIG. 2D, FIG. 2E and FIG. 2F as described below. In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes.

Figure 2A:
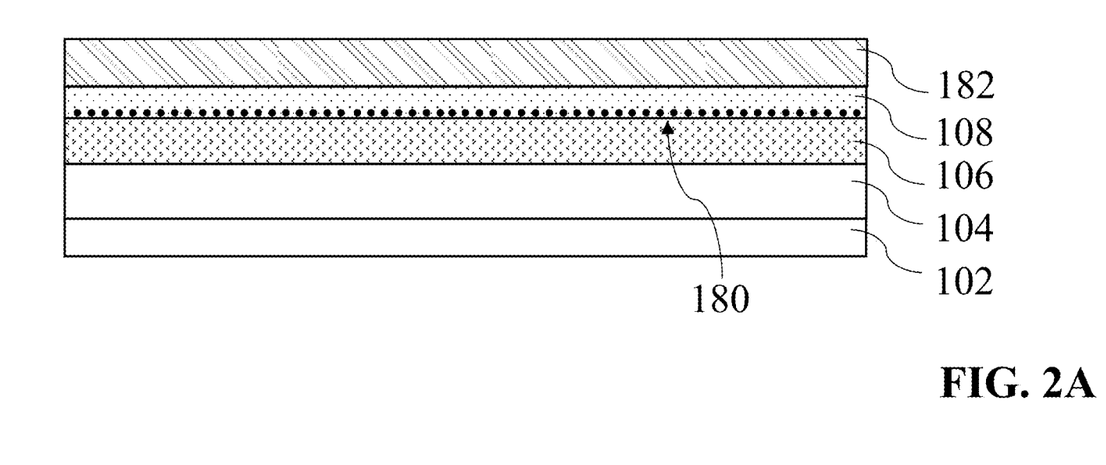
FIG. 2A, FIG. 2B, FIG. 2C, FIG. 2D, FIG. 2E and FIG. 2F show different stages of a method for manufacturing a nitride-based semiconductor device according to some embodiments of the present disclosure.

Referring to FIG. 2A, a buffer layer 104 is formed on a substrate 102 by using deposition techniques. A nitride-based semiconductor layer 106 is formed on the buffer layer 104 by using deposition techniques. A nitride-based semiconductor layer 108 can be formed on the nitride-based semiconductor layer 106 by using deposition techniques, so that a heterojunction is formed therebetween. A continuous 2DHG region 180 is formed near the heterojunction. A blanket doped nitride-based semiconductor layer 182 is formed on the nitride-based semiconductor layer 108. In some embodiments, the deposition techniques can be performed for forming a blanket layer.

Figure 2B:
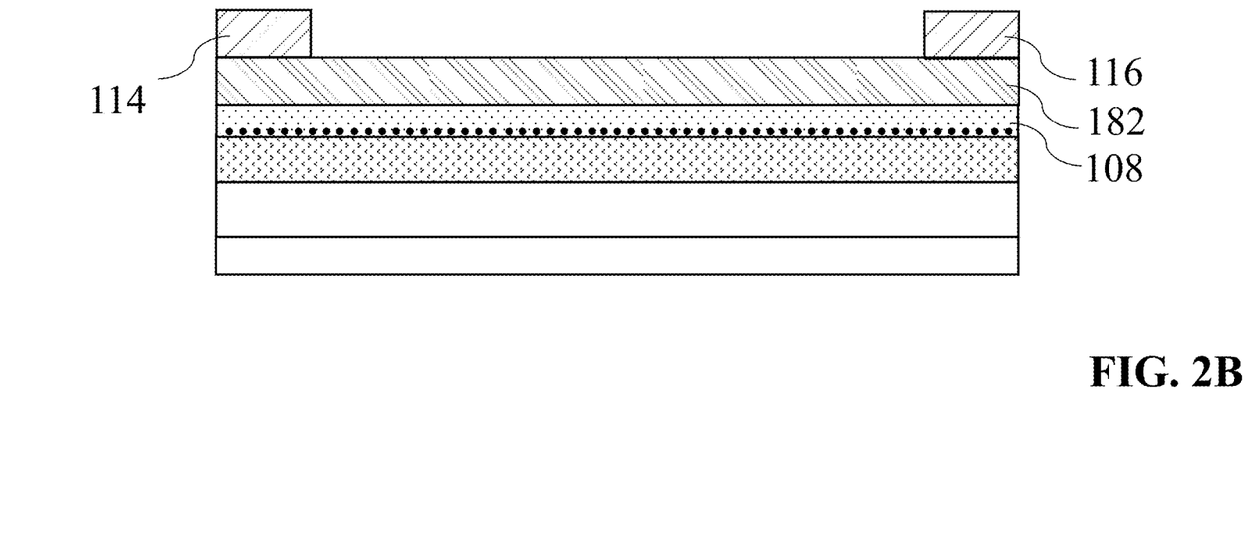

Referring to FIG. 2B, electrodes 114 and 116 are formed above the blanket nitride-based semiconductor layer 182 and the nitride-based semiconductor layer 108. The formation of the electrodes 114 and 116 includes deposition techniques and a patterning process. In some embodiments, the patterning process can include photolithography, exposure and development, etching, other suitable processes, or combinations thereof.

Figure 2C:
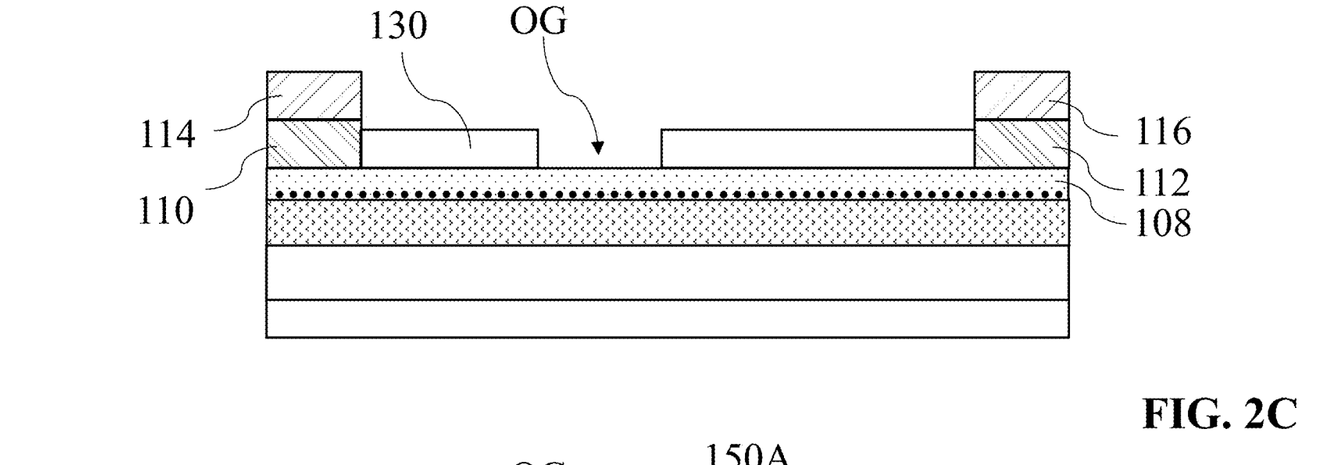

Referring to FIG. 2C, an etching process is performed on the blanket nitride-based semiconductor layer 182 to remove the excess portions thereof to form the nitride-based semiconductor layers 110 and 112. Then, a passivation layer 130 is formed on the nitride-based semiconductor layer 108. The passivation layer 130 has an opening OG exposing a portion of the nitride-based semiconductor layer 108. In some embodiments, the formation of the passivation layer 130 is performed by forming a blanket passivation layer on the electrodes 114 and 116 and the nitride-based semiconductor layer 108 and by a patterning process. The patterning process is performed to remove the excess portions of the blanket passivation layer, so as to expose the electrodes 114 and 116 and form the opening OG.

Figure 2D:
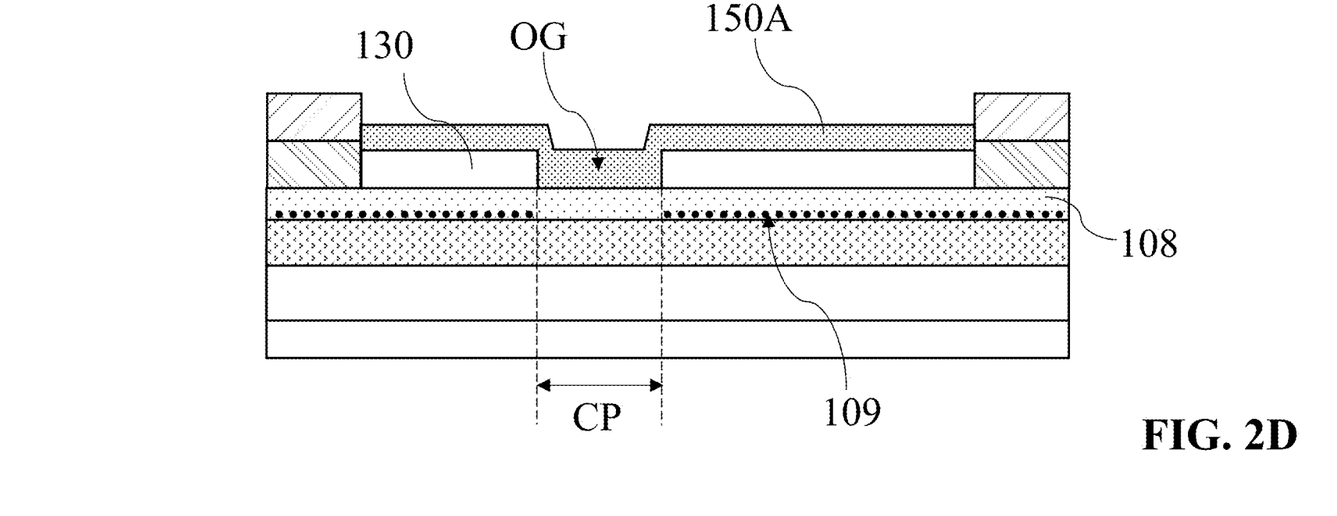

Referring to FIG. 2D, a stress modulation layer 150A is formed above the passivation layer 130. The stress modulation layer 150A fills into the opening OG to make contact with a contact portion CP of the nitride-based semiconductor layer 108. Since the stress modulation layer 150A can apply stress to the contact portion CP, the polarization effect therein would be suppressed. As such, the zone of the 2DHG region in the contact portion CP would have a low hole concentration as afore described and thus a discontinuous 2DHG 109 is created.

Figure 2E:
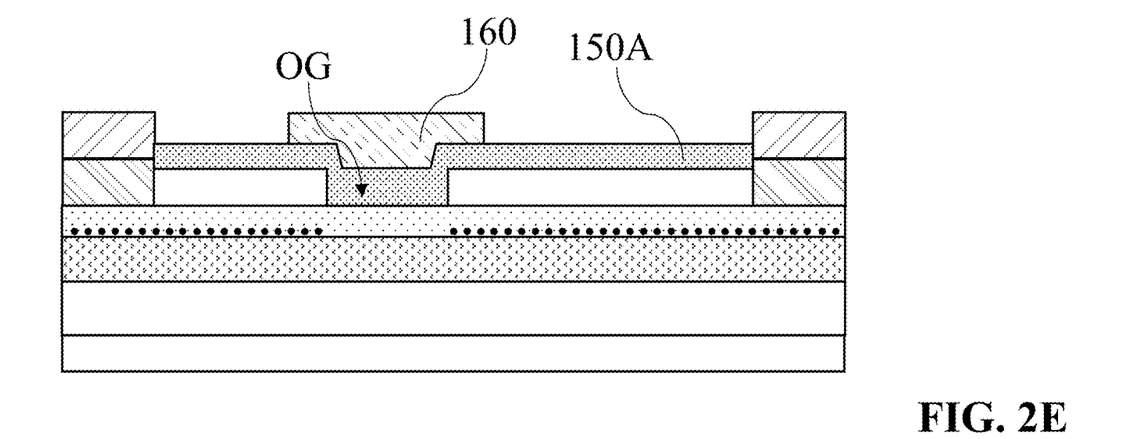

Referring to FIG. 2E, a gate electrode 160 is formed on the stress modulation layer 150A and aligns with the opening OG. The formation of the gate electrode 160 includes deposition techniques and a patterning process.

Figure 2F:
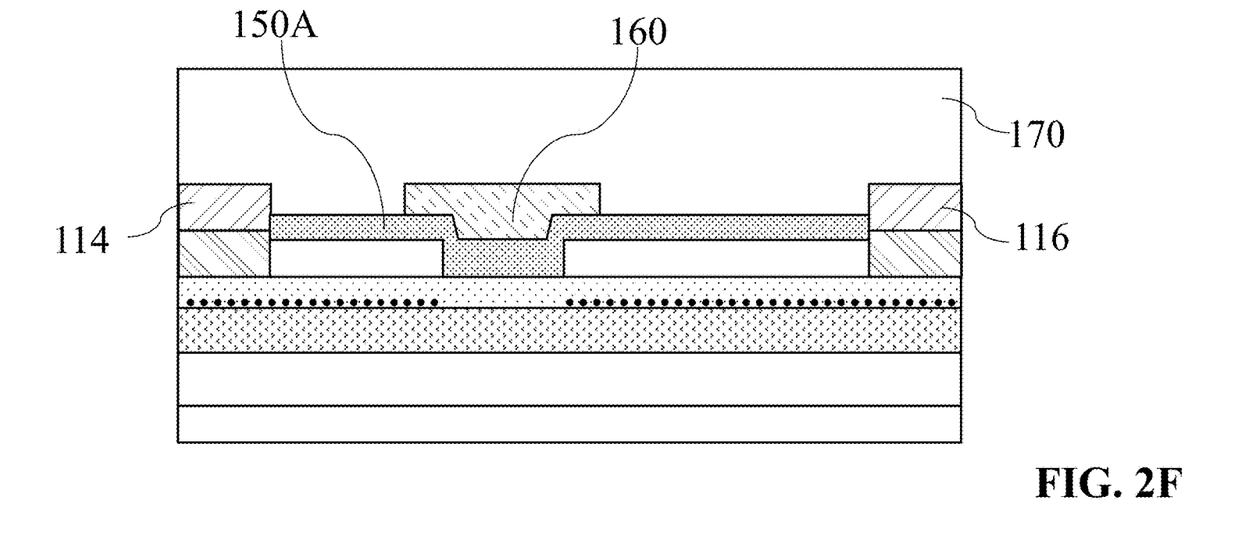

Referring to FIG. 2F, a passivation layer 170 is formed to cover the source, drain and the electrodes 114 and 116, the gate electrode 160, and the stress modulation layer 150A. Thereafter, contact vias and patterned conductive layer can be formed, obtaining the configuration of the semiconductor device 10A as shown in FIG. 1B.

Figure 3:
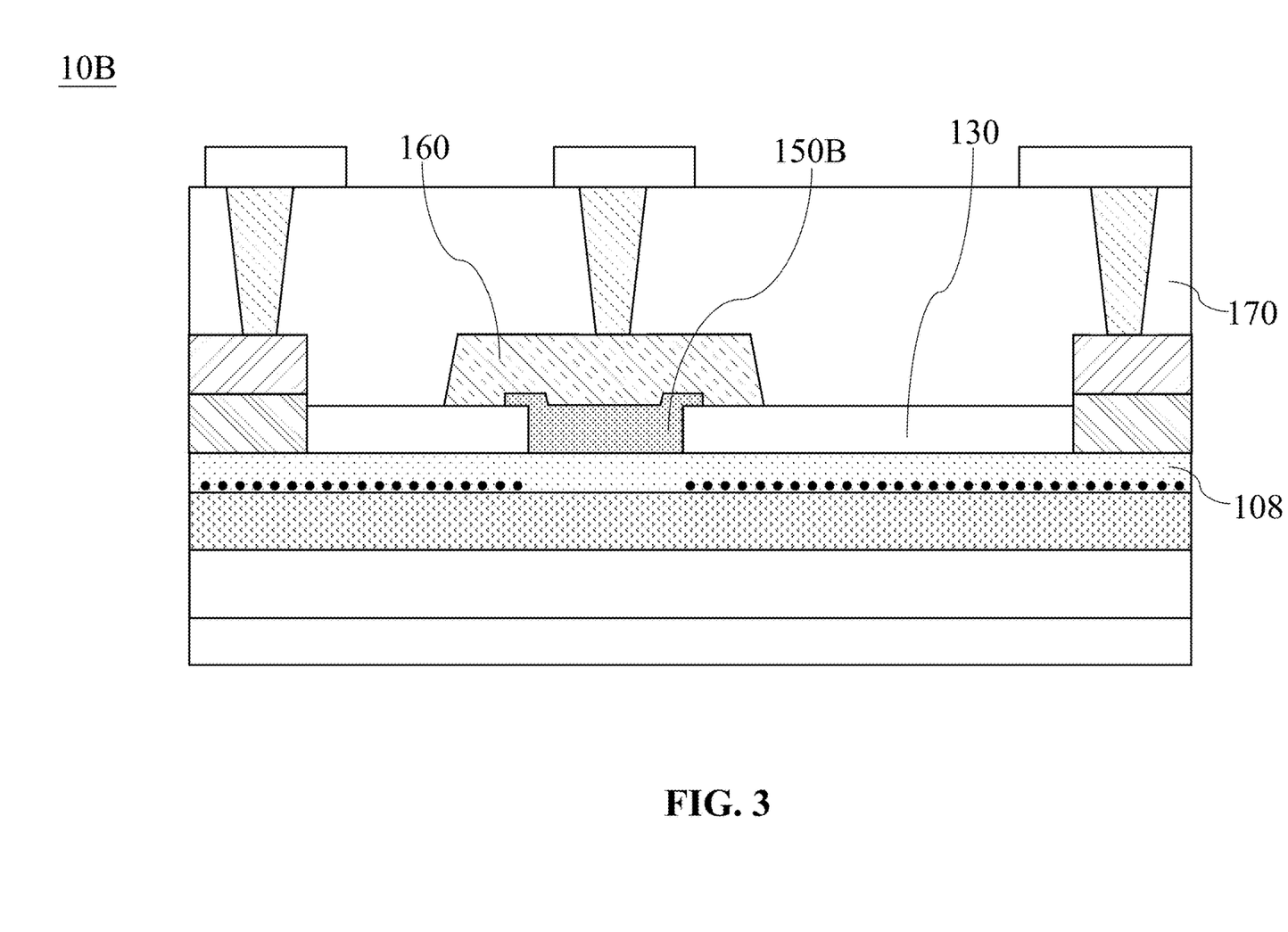
FIG. 3 is a vertical cross-sectional view of a semiconductor device according to some embodiments of the present disclosure.

FIG. 3 is a vertical cross-sectional view of a semiconductor device 10B according to some embodiments of the present disclosure. The semiconductor device 10B is similar to the semiconductor device 10A as described and illustrated with reference to FIG. 1A and FIG. 1B, except that the stress modulation layer 150A of the semiconductor device 10A is replaced with the stress modulation layer 150B. In the exemplary illustration of FIG. 3, portions of a top surface of the passivation layer 130 are free from coverage of the stress modulation layer 150B. The passivation layer 130 is exposed by the stress modulation layer 150B. The stress modulation layer 150B partially covers the passivation layer 130. The stress modulation layer 150B can separate the passivation layer 130. The passivation layer 130 can be divided by the stress modulation layer 150B. The gate electrode 160 can be wider than the stress modulation layer 150B. The gate electrode 160 can make contact with the passivation layer 130. A top surface of the stress modulation layer 150B can be entirely covered with the gate electrode 160. An entirety of the stress modulation layer 150 can be embedded in the passivation layer 130 and beneath the gate electrode 160. Shrinkage of the stress modulation layer 150B can result in relatively less stress on the passivation layer 130, which can improve the reliability and stress control of the semiconductor device 10B.

In some other embodiments, once the stress imposed on the passivation layer 130 exceeds a threshold S, a peeling issue may arise. However, in the embodiment as shown in FIG. 3, the semiconductor device 10B can have a relatively great threshold Sh. In other words, the passivation layer 130 can survive even the stress imposed on the passivation layer 130 exceeds the threshold S. In other words, the passivation layer 130 does not peel off other element(s) as illustrated in FIG. 3 when the stress imposed on the passivation layer 130 goes over the threshold S.

The profile of the gate electrode 160 can be a trapezoid. A contact area between the gate electrode 160 and the passivation layer 170 can be thus increased, thereby enhancing a bonding force therebetween. Thus, the reliability of the semiconductor device 10B can be further improved. The semiconductor devices 10B can meet different electrical requirements.

Figure 4:
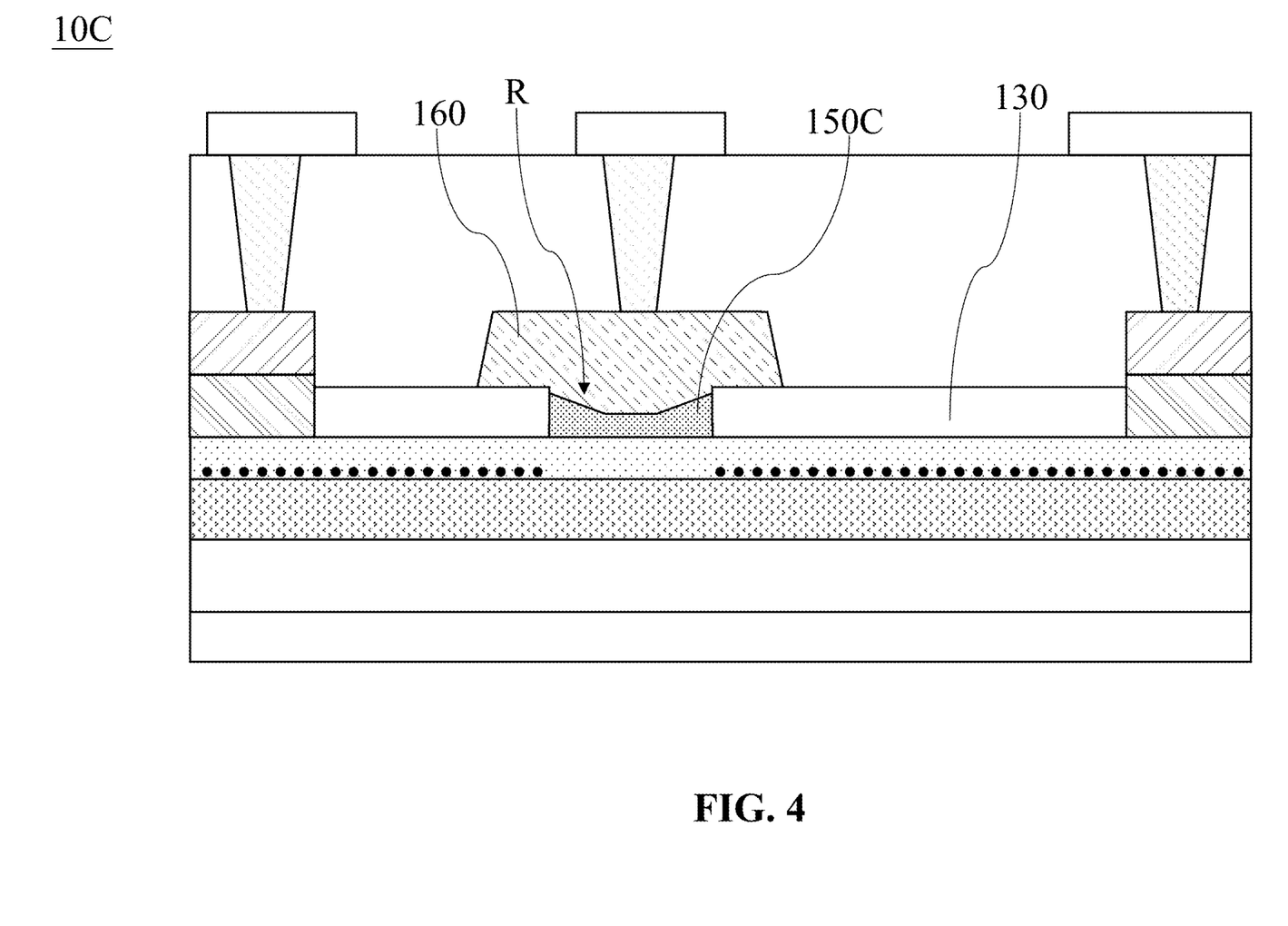
FIG. 4 is a vertical cross-sectional view of a semiconductor device according to some embodiments of the present disclosure.

FIG. 4 is a vertical cross-sectional view of a semiconductor device 10C according to some embodiments of the present disclosure. The semiconductor device 10C is similar to the semiconductor device 10B as described and illustrated with reference to FIG. 3, except that the stress modulation layer 150B is replaced by the stress modulation layer 150C. In the exemplary illustration of FIG. 4, an entirety of the stress modulation layer 150C is in a position lower than the top surface of the passivation layer 130, such that the downward protruding portion of the gate electrode 160 can further extend to the region R between the inner sidewalls of the passivation layer 130. The downward protruding portion of the gate electrode 160 has a bottom in a position lower than the top surface of the passivation layer 130. The stress modulation layer 150C can have a substantively concave structure. The stress modulation layer 150C can have a substantively concave surface. The stress modulation layer 150C can have a dimple or recess to receive the gate electrode 160. The above-mentioned structure can achieve a relatively flat top surface of the gate electrode 160, which can contribute positively to the flatness of the structure formed on the gate electrode 160. In other words, the topography of the gate electrode 160 and the structure formed thereafter can get better controlled, which can improve the yield rate of the semiconductor device 10C.

Figure 5:
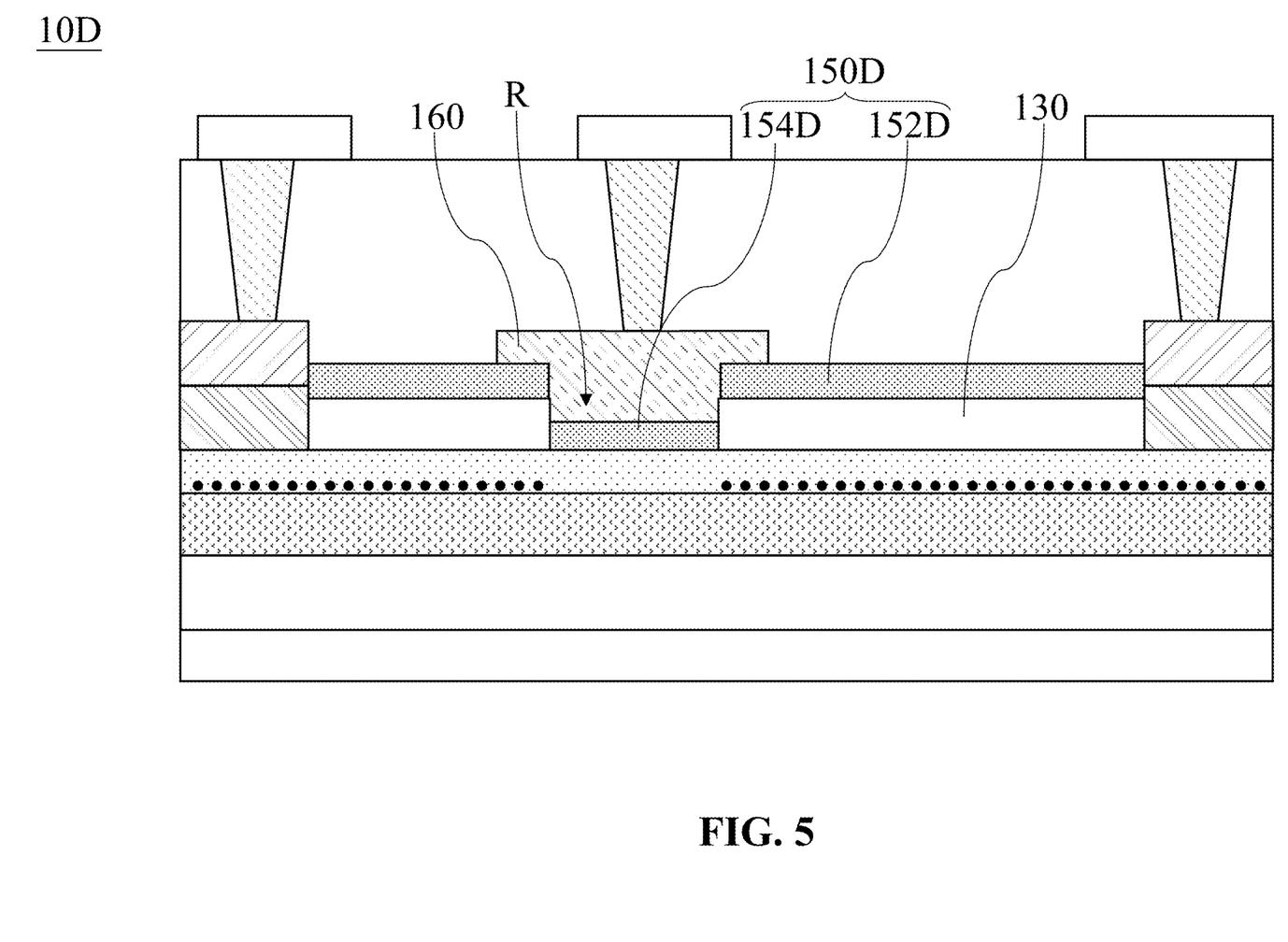
FIG. 5 is a vertical cross-sectional view of a semiconductor device according to some embodiments of the present disclosure.

FIG. 5 is a vertical cross-sectional view of a semiconductor device 10D according to some embodiments of the present disclosure. The semiconductor device 10D is similar to the semiconductor device 10A as described and illustrated with reference to FIG. 1A and FIG. 1B, except that the stress modulation layer 150A is replaced by the stress modulation layer 150D. In the exemplary illustration of FIG. 5, the stress modulation layer 150D includes physically separated portions 152D and 154D. The portion 154D of the stress modulation layer 150D is in a position lower than the top surface of the passivation layer 130. The portion 152D can serve as protection layer or sacrificial layer in the subsequent process. Similarly, the downward protruding portion of the gate electrode 160 can further extend to the region R between the inner sidewalls of the passivation layer 130.

In the semiconductor devices 10C and 10D, as compared to the semiconductor device 10A, a distance between the gate electrode 160 and the nitride-based semiconductor layer 108 can be decreased due to the afore-mentioned configuration, and thus the conductivity of the contact portion CP can be better controlled. As such, the semiconductor devices 10C and 10D can comply with different electrical requirements, including requirements for high voltage devices and low voltage devices.

Figure 6:
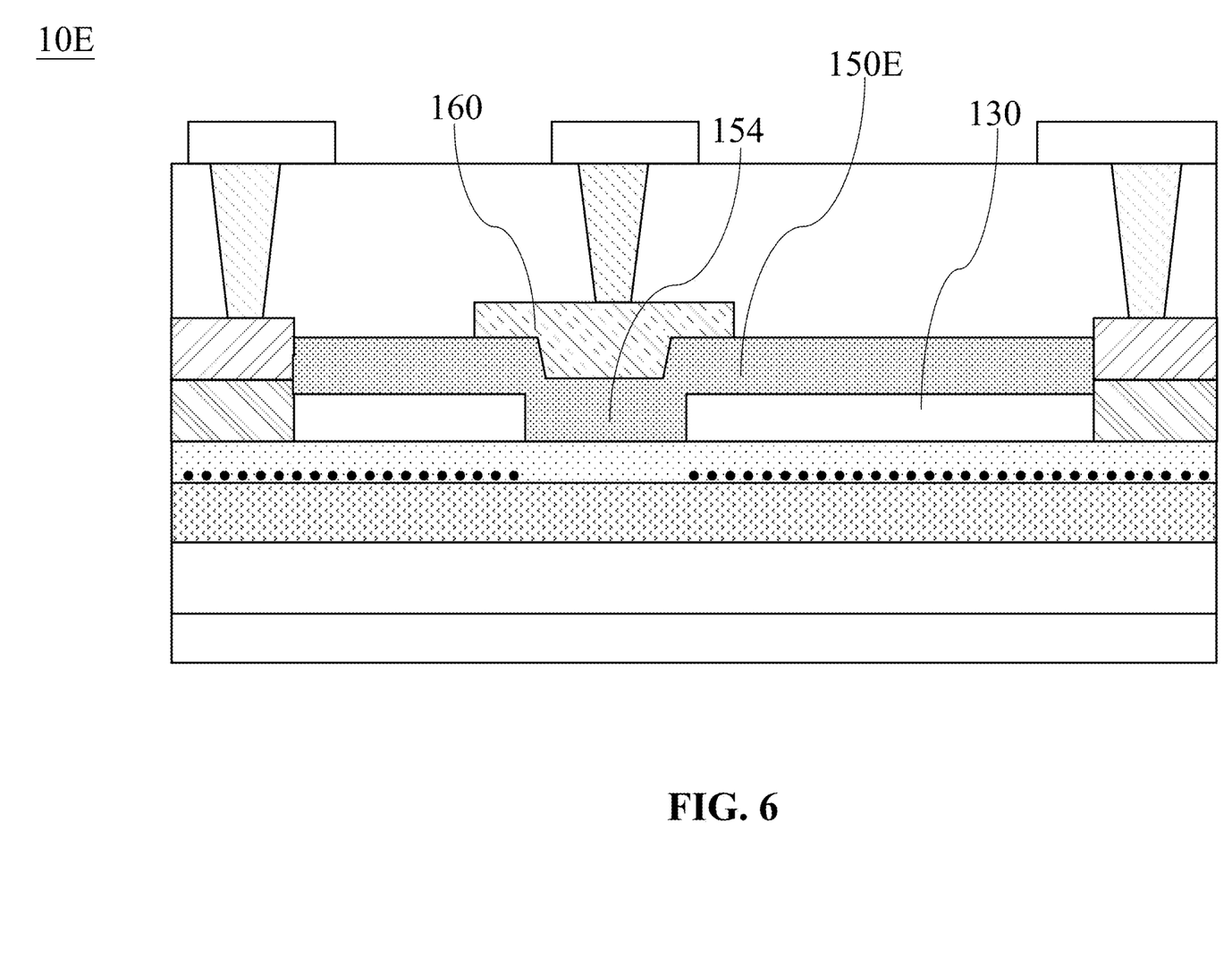
FIG. 6 is a vertical cross-sectional view of a semiconductor device according to some embodiments of the present disclosure.

FIG. 6 is a vertical cross-sectional view of a semiconductor device 10E according to some embodiments of the present disclosure. The semiconductor device 10E is similar to the semiconductor device 10A as described and illustrated with reference to FIG. 1A and FIG. 1B, except that the stress modulation layer 150A is replaced by the stress modulation layer 150E. In the exemplary illustration of FIG. 6, the bottom-most surface of the gate electrode 160 can be higher than the top surface of the passivation layer 130, which means that the bottom-most surface can be non-coplanar with the top surface of the passivation layer 130. As such, the semiconductor device 10E can meet different electrical requirements, such as a relatively high or a relatively low voltage device design. For example, the stress modulation layer 150E can be changed to have a relatively great thickness so the stress modulation brought by the relatively thick portion 154E is suitable for the relatively high voltage design.

Based on the above description, the present disclosure provides stress-controlled semiconductor devices. Two nitride-based semiconductor layers with different bandgaps are stacked to form a heterojunction therebetween with a 2DHG region. The 2DHG region is present in the nitride-based semiconductor layer which is called a p-channel layer. The stress modulation layer of the semiconductor device is in contact and provides a stress with a portion of the p-channel layer, such that a zone of the 2DHG region has a reduced hole concentration, thereby disrupting the continuity of the 2DHG region. Accordingly, a discontinuous 2DHG region is formed, and the p-channel enhancement mode semiconductor device can be realized. The manufacturing process of the semiconductor device is simple and avoids using additional etching step to etch the p-channel layer for interfering with the continuity of the 2DHG region. Thus, the semiconductor device of the present disclosure can have a good reliability, good electrical properties, and a good yield rate.

The embodiments were chosen and described in order to best explain the principles of the disclosure and its practical application, thereby enabling others skilled in the art to understand the disclosure for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to +5%, less than or equal to +4%, less than or equal to ±3%, less than or equal to ±2%, less than or equal to +1%, less than or equal to +0.5%, less than or equal to 0.1%, or less than or equal to 0.05%. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A semiconductor device comprising:
a first nitride-based semiconductor layer;
a second nitride-based semiconductor layer disposed on the first nitride-based semiconductor layer and having a bandgap less than a bandgap of the first nitride-based semiconductor layer to form a heterojunction therebetween with a two dimensional hole gas (2DHG) region;
a source electrode and a drain electrode disposed over the second nitride-based semiconductor layer;
a passivation layer disposed over the second nitride-based semiconductor layer and between the source and drain electrodes;
a stress modulation layer disposed over the second nitride-based semiconductor layer and extending along at least one sidewall of the passivation layer to make contact with the second nitride-based semiconductor layer, so as to form an interface, wherein the stress modulation layer extends from a top surface of the passivation layer; and
a gate electrode disposed over the stress modulation layer and between the source and drain electrodes, wherein the gate electrode is located directly above the interface between the stress modulation layer and the second nitride-based semiconductor layer.

2. The semiconductor device of claim 1, wherein the stress modulation layer entirely fills in a region between the sidewalls of the passivation layer.

3. The semiconductor device of claim 1, wherein the stress modulation layer has a first portion above a top surface of the passivation layer and a second portion in contact with the second nitride-based semiconductor layer and connected to the first portion.

4. The semiconductor device of claim 3, wherein the gate electrode covers the first and second portions of the stress modulation layer.

5. The semiconductor device of claim 4, wherein the gate electrode has a downward protruding portion received by the stress modulation layer.

6. The semiconductor device of claim 1, wherein the stress modulation layer has a lattice constant and a bandgap different than those of the second nitride-based semiconductor layer.

7. The semiconductor device of claim 1, wherein the stress modulation layer comprises AlN, BN, AlBN, GaN, or combinations thereof.

8. The semiconductor device of claim 1, wherein the source electrode is closer to the interface formed between the stress modulation layer and the second nitride-based semiconductor layer than the drain electrode.

9. The semiconductor device of claim 1, wherein the gate electrode has a bottom-most surface in a position higher than the passivation layer and in contact with the stress modulation layer.

10. The semiconductor device of claim 1, wherein the interface formed between the stress modulation layer and the second nitride-based semiconductor layer is oblong that has long sides parallel with the source and drain electrodes in the top view of the semiconductor device.

11. The semiconductor device of claim 1, further comprising:
a first doped nitride-based semiconductor layer disposed between the second nitride-based semiconductor layer and the source electrode; and
a second doped nitride-based semiconductor layer disposed between the second nitride-based semiconductor layer and the drain electrode, wherein the passivation layer abuts against sidewalls of the first and second doped nitride-based semiconductor layers.

12. The semiconductor device of claim 1, wherein an entirety of the stress modulation layer is in a position lower than a top surface of the passivation layer.

13. The semiconductor device of claim 1, wherein the gate electrode has a bottom portion that fills in a region between the sidewalls of the passivation layer.

14. The semiconductor device of claim 1, wherein the stress modulation layer has a pair of oblique inner side surfaces facing each other and in contact with the gate electrode.

15. A method for manufacturing a semiconductor device, comprising:
forming a first nitride-based semiconductor layer;
forming a second nitride-based semiconductor layer on the first nitride-based semiconductor layer to form a heterojunction therebetween with a two dimensional hole gas (2DHG) region;

forming a source electrode and a drain electrode above the second nitride-based semiconductor layer;

forming a passivation layer above the second nitride-based semiconductor layer;

removing a portion of the passivation layer to form an opening exposing the second nitride-based semiconductor layer;

forming a stress modulation layer above the passivation layer and filling into the opening to make contact with the second nitride-based semiconductor layer, wherein the stress modulation layer extends from a top surface of the passivation layer; and forming a gate electrode above the stress modulation layer and aligning with the opening.

16. The method of claim 15, wherein the stress modulation layer has a lattice constant and a bandgap different than those of the second nitride-based semiconductor layer.

17. The method of claim 15, wherein the stress modulation layer is formed such that the 2DHG region has a zone beneath the gate electrode with a hole concentration reduced.

18. The method of claim 15, wherein the gate electrode is formed to have a downward protruding portion received by the stress modulation layer.

19. The method of claim 15, wherein the stress modulation layer comprises AlN, BN, AlBN, GaN, or combinations thereof.

20. A semiconductor device comprising:
a first nitride-based semiconductor layer;
a second nitride-based semiconductor layer disposed on the first nitride-based semiconductor layer and having a bandgap less than a bandgap of the first nitride-based semiconductor layer to form a heterojunction therebetween with a two dimensional hole gas (2DHG) region;
a source electrode and a drain electrode disposed over the second nitride-based semiconductor layer;
a passivation layer disposed over the second nitride-based semiconductor layer and between the source and drain electrodes;
a stress modulation layer disposed over the second nitride-based semiconductor layer and extending along at least one sidewall of the passivation layer to make contact with the second nitride-based semiconductor layer, so as to form an interface, wherein the stress modulation layer has a first portion above a top surface of the passivation layer and a second portion in contact with the second nitride-based semiconductor layer and connected to the first portion; and
a gate electrode disposed over the stress modulation layer and between the source and drain electrodes, wherein the gate electrode is located directly above the interface between the stress modulation layer and the second nitride-based semiconductor layer.

* * * * *